United States Patent
Kartschoke et al.

[11] Patent Number: 5,867,038
[45] Date of Patent: Feb. 2, 1999

[54] SELF-TIMED LOW POWER RATIO-LOGIC SYSTEM HAVING AN INPUT SENSING CIRCUIT

[75] Inventors: Paul David Kartschoke, Williston; Norman Jay Rohrer, Underhill, both of Vt.; Timothy Sulzbach, Austin, Tex.

[73] Assignee: International Business Machines Corporation, Armonk, N.Y.

[21] Appl. No.: 777,689

[22] Filed: Dec. 20, 1996

[51] Int. Cl.$^6$ .............................. H03K 19/094; G05F 3/02
[52] U.S. Cl. .............................. 326/45; 326/93; 327/544; 327/143
[58] Field of Search .............................. 326/93, 39, 45, 326/41, 38; 327/544, 143

[56] References Cited

U.S. PATENT DOCUMENTS

| | | |
|---|---|---|
| 4,233,667 | 11/1980 | Devine et al. . |
| 4,288,831 | 9/1981 | Kolikian ..................... 361/92 |
| 4,570,091 | 2/1986 | Yauda et al. . |
| 4,698,748 | 10/1987 | Juzswik et al. ............ 364/200 |
| 4,803,665 | 2/1989 | Kasa ........................... 326/88 |
| 4,831,285 | 5/1989 | Gaiser . |
| 4,839,539 | 6/1989 | Takata et al. ............... 326/38 |
| 4,893,033 | 1/1990 | Itano et al. . |
| 4,906,870 | 3/1990 | Gongwer ..................... 326/39 |
| 5,033,017 | 7/1991 | Taniai et al. . |
| 5,057,712 | 10/1991 | Trinh et al. . |
| 5,243,575 | 9/1993 | Sambandan et al. . |
| 5,250,859 | 10/1993 | Kaplinsky ..................... 326/40 |
| 5,311,079 | 5/1994 | Ditlow et al. . |
| 5,481,222 | 1/1996 | Utz . |

FOREIGN PATENT DOCUMENTS

| | | | |
|---|---|---|---|
| 360021628 | 2/1985 | Japan ........................ 326/45 |

*Primary Examiner*—Michael J. Tokar
*Assistant Examiner*—Daniel D. Chang
*Attorney, Agent, or Firm*—Schmeiser, Olsen & Watts; Eugene I. Shkurko

[57] ABSTRACT

A ratio-logic system having an input sensing device and a resetable delay device is disclosed. The input sensing device receives an input having a first logic state and a second input having a second logic state. The input sensing device then asynchronously outputs a first state-change signal if the first logic state differs from the logic state of a previous input, and a second state-change signal if the second logic state differs from the first logic state. The resetable delay device receives the first and second state-change signals and asynchronously outputs a power-up signal to a ratio-logic device for a predetermined amount of time after the first state-change signal is received. The resetable delay device then powers-down the ratio-logic device after the predetermined amount of time is over. The predetermined amount of time is reset if the input sensing device receives the second state-change signal before the predetermined amount of time is over.

18 Claims, 3 Drawing Sheets

SELF-TIMED LOW POWER RATIO-LOGIC SYSTEM HAVING AN INPUT SENSING CIRCUIT

BACKGROUND OF THE INVENTION

1. Technical Field

The invention relates generally to ratio-logic systems, and more specifically, to input sensing circuits for low power ratio-logic systems.

2. Background Art

Ratio-logic circuits, such as Programmable Logic Arrays (PLA) or custom control paths, are used in microprocessor design for several reasons. Two reasons include: ratio-logic circuits perform logic functions at a high speed; and ratio-logic circuits provide circuitry that may be used in a compact layout. One disadvantage, though, of using ratio-logic circuits in any device is the large amount of power consumed, which is caused by the DC current paths that exist in the circuit.

As described in U.S. Pat. No. 4,233,667, "Demand Powered Programmable Logic Array", issued to Devine et al. on Nov. 11, 1980, static PLA power is reduced by synchronously decoding the logical inputs to determine if the PLA is required to perform a computation. If certain sections of the PLA do not need to perform any computations, those sections are powered down. Although PLA power is reduced in the above-mentioned patent, the PLA cannot be completely powered down, because only certain sections of the PLA are disabled. Furthermore, the delay that occurs by first clocking and then decoding the logical inputs could impede the performance of the circuit. In addition, the power-reducing elements of the aforementioned circuit are not self-contained and therefore are not conducive to other PLA or ratio-logic designs.

Other examples of ratio-logic systems with power reducing circuits include: U.S. Pat. No. 5,033,017, "Programmable Logic Array with Reduced Power Consumption", issued to Taniai et al. in July 1991; and U.S. Pat. No. 5,311,079, "Low Power, High Performance PLA", issued to Ditlow et al. in May 1994. Although different techniques are discussed for reducing power in PLAs, the aforementioned patents either use power reduction devices that clock their inputs, and/or do not allow for a complete evaluation of all inputs by the ratio-logic circuit.

Accordingly, a need has developed in the art for a low power ratio-logic system that provides asynchronous input sensing circuitry for reducing power in a variety of ratio-logic circuits and provides complete evaluation of all the inputs by the ratio-logic circuit.

SUMMARY OF THE INVENTION

It is thus an advantage of the present invention to provide a ratio-logic system that will asynchronous detect and process inputs to reduce power in a variety of ratio-logic circuits.

It is another advantage of the present invention to provide a ratio-logic system that will allow for a complete evaluation of all inputs by the ratio-logic circuit.

The foregoing and other advantages of the invention are realized by a ratio-logic system comprising an input sensing device and a resetable delay device. The input sensing device receives a first input having a first logic state and asynchronously outputs a first state-change signal if the first logic state differs from the logic state of a previous input. The input sensing device also asynchronously outputs a second state-change signal if a second logic state of a second input received after the first input differs from the first logic state. The resetable delay device receives the first and second state-change signals and asynchronously outputs a power-up signal to a ratio-logic device for a predetermined amount of time after the first state-change signal is received. The resetable delay device then powers-down the ratio-logic device after the predetermined amount of time is over. The predetermined amount of time is reset if the resetable delay device receives the second state-change signal before the predetermined amount of time is over.

The foregoing and other objects, features, and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
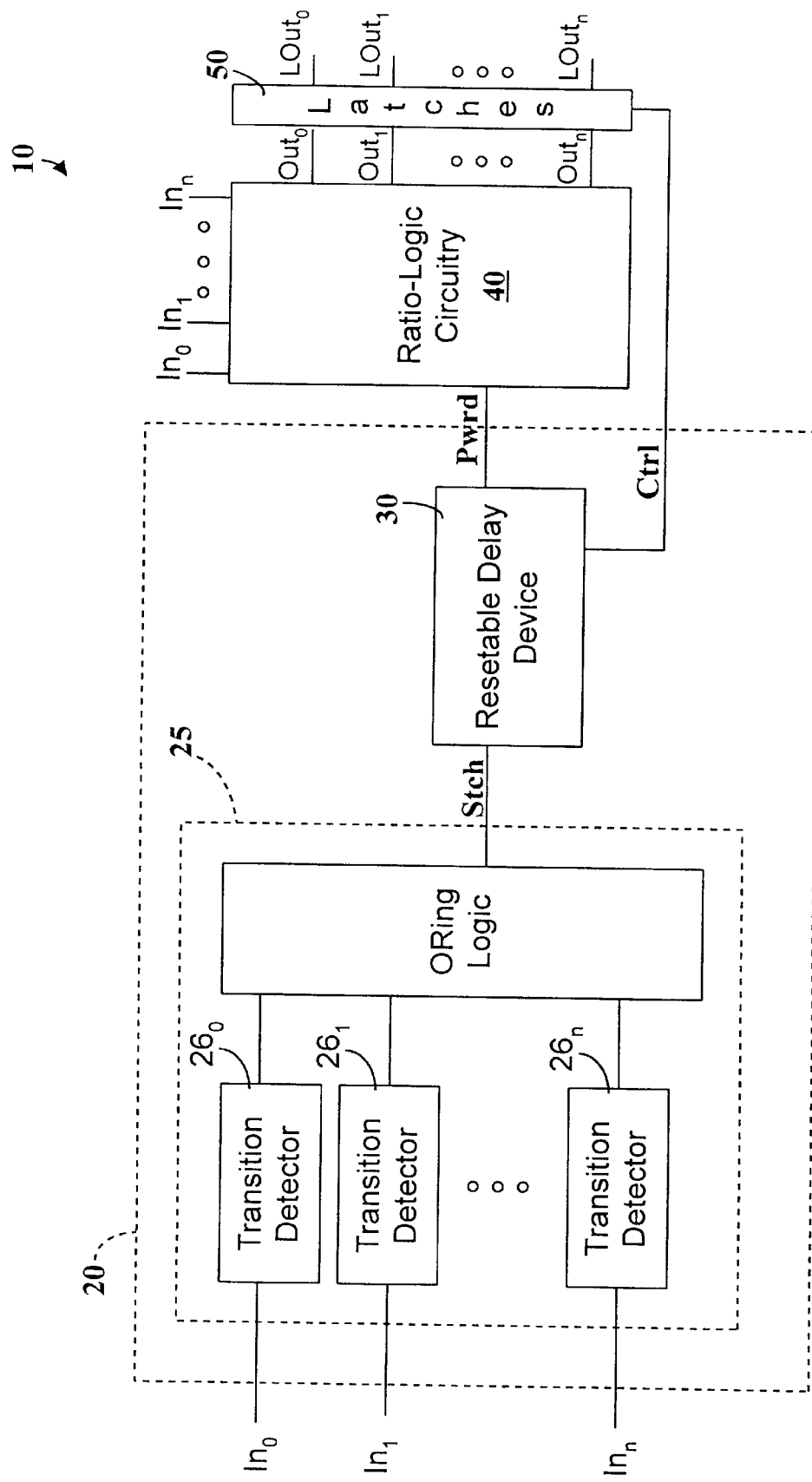
FIG. 1 is a block diagram of a ratio-logic system in accordance with a preferred embodiment of the present invention.

Referring to FIG. 1, the low power ratio-logic system 10 of the present invention comprises an input sensing device 25, a resetable delay device 30, a ratio-logic device 40, and latches 50. Input sensing device 25 includes transition detector circuits $26_0$–$26_n$, which receives inputs $In_0$–$I_n$, respectively, and ORing Logic 28. Each transition detector circuit detects if its corresponding input has transitioned from one state to another, and outputs a transition detection signal accordingly. The transition detection signals of each transition detector are then logically OR'd together through ORing logic 28. The output of ORing logic 28 (i. e., state-change signal STCH) will then start or reset resetable delay device 30, which in turn effectively powers-up ratio-logic device 40 through power-down signal PWRD (PWRD=0) for a predetermined amount of time. Ratio-logic device 40 may then evaluate the input. The outputs of ratio-logic device 40 $OUT_0$–$OUT_n$ are latched through latches 50 so that the outputs will not be lost when the circuit is disabled at the end of the delay. Latches 50 are controlled through control signals, CTRL and CTRLB, generated by resetable delay element 30.

As aforementioned, the system of the present invention is self-timed. That is, the outputs from input sensing device 25 and resetable delay element 30 are asynchronous. The resetable delay element 30 allows all inputs to be effectively evaluated by ratio-logic device 40, since a second input signal will reset the resetable delay element 30 for the same predetermined amount of time used for a first input signal. In this way, power will continue to be provided to the ratio-logic device 40 until the predetermined amount of time has elapsed after the last received event signal. The predetermined amount of time is generally equal to the amount of time ratio-logic device 40 takes to evaluate the slowest transition. Thus, in operation, input sensing device 25 may receive a first input having a first logic state and then receive a second input having a second logic state. Input sensing device 25 asynchronously outputs a first state-change signal if the first logic state differs from the logic state of a previous input, and asynchronously outputs a second statechange signal if the second logic state differs from the first logic state. Resetable delay device 30 receives the first state-change signal and asynchronously outputs a power-up signal (PWRD=0) to the ratio-logic device for a predetermined amount of time after the first state-change signal is received. Resetable delay device 30 also outputs a power-down signal (PWRD=1) to ratio-logic device 40 after the predetermined amount of time is over. The predetermined amount of time is reset if resetable delay device 30 receives the second state-change signal before the predetermined amount of time is over.

Figure 2:
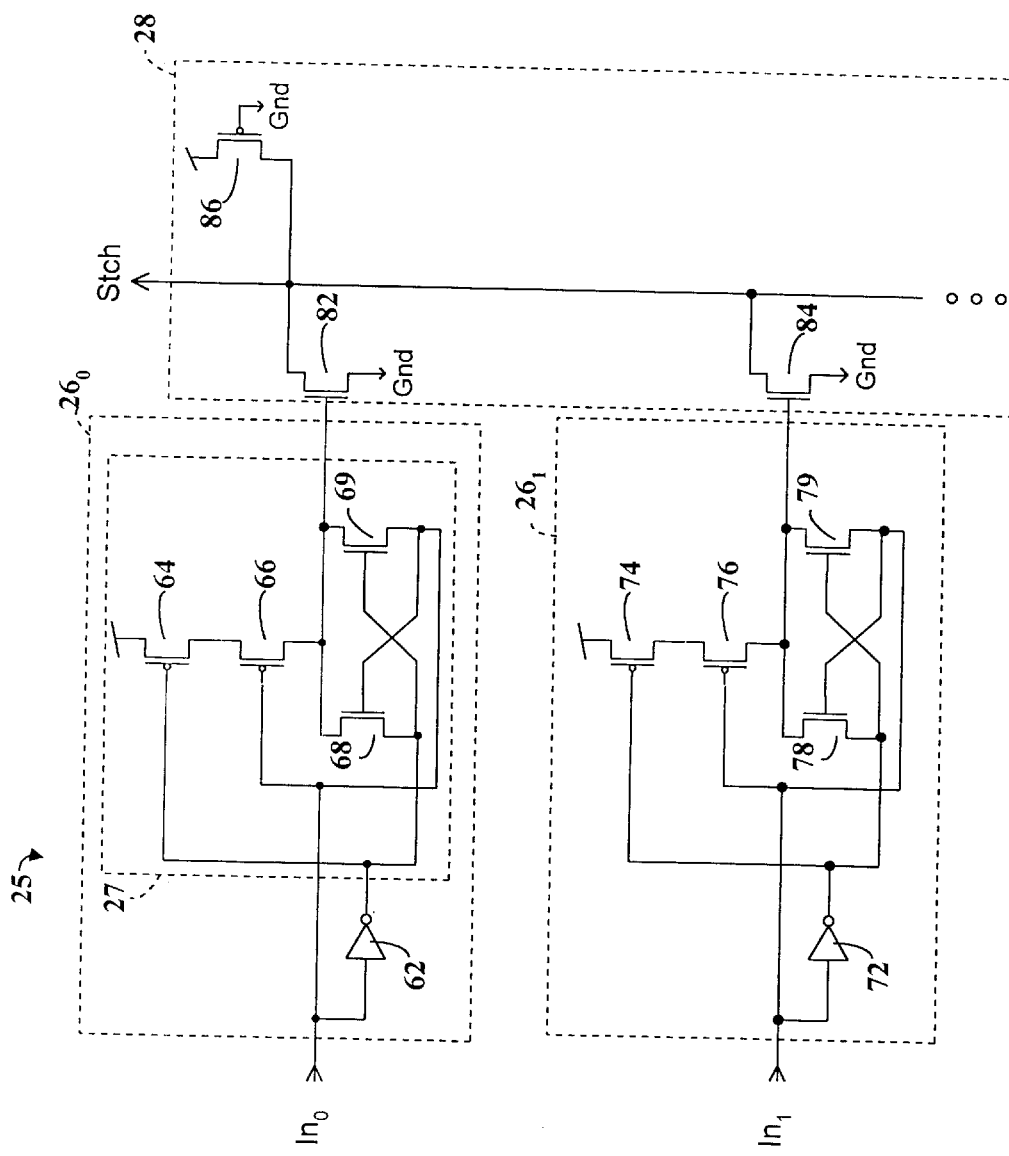
FIG. 2 illustrates an exemplary circuit diagram of the sensing device of FIG. 1.

FIG. 2 illustrates an exemplary circuit for sensing device 25 of FIG. 1. As aforementioned, sensing device 25 includes transition detector circuits $26_0$–$26_n$ and ORing logic 28. Each transition detector circuit 26 comprises exclusive-OR (XOR) logic. One input for XOR circuit 27 comes directly from the global inputs and the other input for XOR circuit 27 comes from a delayed and inverted version of the global input. That is, for transition detector circuit $26_0$, $In_0$ is connected to the input of inverter 62, to the gate of p-channel field-effect transistor (PFET) 66, and to the source of n-channel field-effect transistor (NFET) 69. The output of inverter 62 is connected to the gate of PFET 64, and to the source of NFET 68. The source of PFET 64 is tied to Vdd, and the drain of PFET 64 is connected to the source of PFET 66. The drains of PFET 66, NFET 68, and NFET 69 are commonly tied to NFET 82 of ORing Logic 28. The gate of NFET 68 is tied to the source of NFET 69 and the gate of NFET 69 is tied to the source of NFET 68.

Similarly, for transition detector circuit $26_1$ (as with any other transition dector circuit and their corresponding inputs), $In_1$ is connected to the input of inverter 72, to the gate of p-channel field-effect transistor (PFET) 76, and to the source of n-channel field-effect transistor (NFET) 79. The output of inverter 72 is connected to the gate of PFET 74, and to the source of NFET 78. The source of PFET 74 is tied to Vdd, and the drain of PFET 74 is connected to the source of PFET 76. The drains of PFET 76, NFET 78, and NFET 79 are commonly tied to NFET 84 of ORing Logic 28. The gate of NFET 78 is tied to the source of NFET 79 and the gate of NFET 79 is tied to the source of NFET 78.

ORing Logic 28 comprises an NFET for each transition detector circuit, which is determined by the number of inputs. The source of each NFET (e.g., NFET 82 and NFET 84) is tied to ground and the drain is connected to the drain of PFET 86. The source of PFET 86 is tied to Vdd and the gate is tied to ground. The drain of PFET 86 and of each NFET are commonly connected to ratio-logic device 40. Thus, a change of state with any of the inputs will pull an NFET of the ORing Logic 28 low, (which is normally high because of PFET 86), causing a power-up signal (PWRD=0) to be transmitted to ratio-logic device 40.

Figure 3:
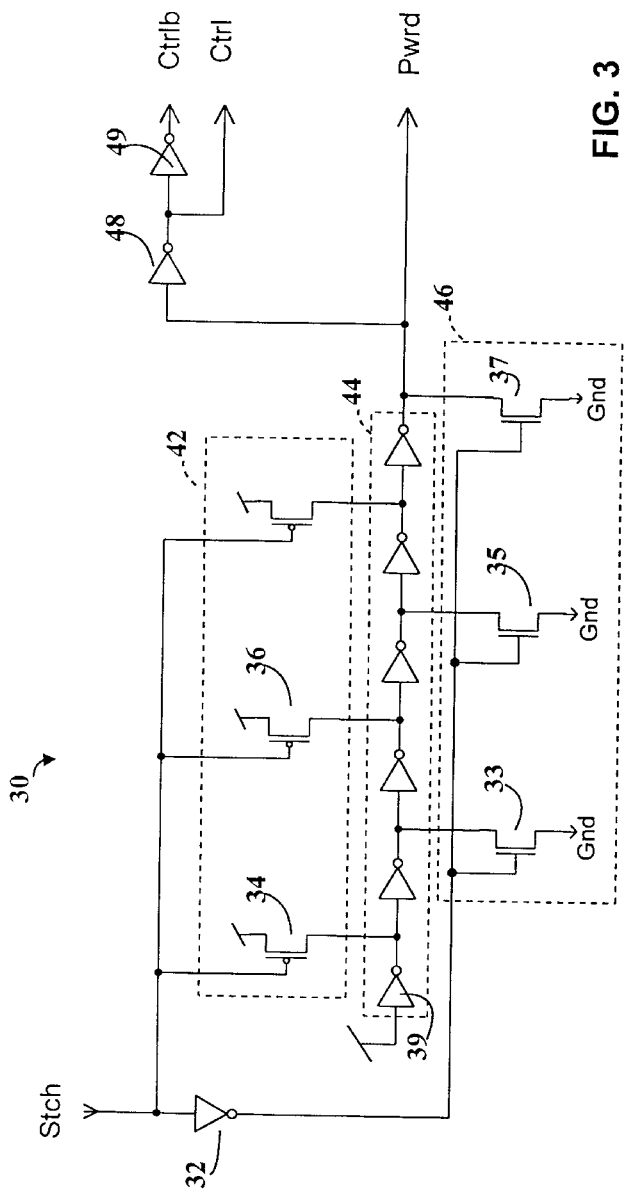
FIG. 3 illustrates an exemplary circuit diagram of the resetable delay device of FIG. 1.

As seen in FIG. 3, resetable delay device 30 comprises inverters 32, 48 and 49; PFETs 42; NFETs 46; and delay line 44. The amount of PFETs, NFETs and inverters in delay line 44 is determined by the amount of time desired for powering-up ratio-logic device 40. This predetermined amount of time, as aforementioned, is usually the time required for the ratio-logic device 40 to evaluate the slowest transition, although other factors may also be used in determining this amount. The power-up/down signal PWRD is coupled to the input of inverter 32, the gates of PFETs 42 (comprising in this example, PFET 34, 36 and 38), and the gates of NFETs 46 (comprising in this example, NFET 33, 35 and 37). The sources of PFETs 42 are tied to Vdd and the drains of PFETs 42 are connected to the inputs of every other inverter of delay line 44, starting with the second inverter. The sources of NFETs 46 are tied to ground and the drains of NFET 33 and 35 are connected to the inputs of every other inverter of delay line 44 starting with the third inverter. Hence, the connections of PFETs 42 alternate with the connections of NFETs 46 inbetween the inverters of delay line 44, with the input of the first inverter 39 of delay line 44 being tied to Vdd. The drain of NFET 37 is connected to the output of delay line 44, to ratio-logic device 40, and to the input of inverter 48. The output of inverter 48 is connected to the input of inverter 49, and to latches 50, and the output of inverter 49 is connected to latches 50.

In operation, the output of input sensing device 25 (state-change signal STCH) will pull NFET 37 low, which powers-up ratio-logic device 40 (PWRD=0) until Vdd propagates through delay line 44, powering-down ratio-logic device 40. As aforementioned, with the input of a second state-change signal, the resetable delay device 30 will reset, thus extending the time ratio-logic device 40 is powered-up. The outputs of inverters 48 and 49 produce the CTRL and CTRLB signals, respectively, which control latches 50, as will be discussed in reference to FIG. 4.

Figure 4:
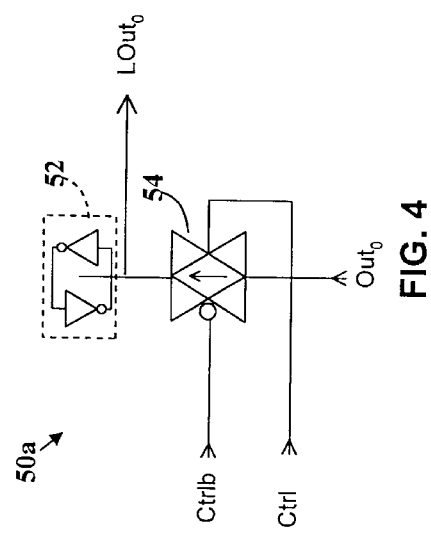
FIG. 4 is an exemplary circuit diagram of the output latch of FIG. 1.

In FIG. 4, one muxed output latch 50a from latches 50 is illustrated. The latch comprises transmission gate 54 and a two-inverter latch 52. An output $OUT_0$ from ratio-logic device 40 is inputted into transmission gate 54. Control signals CTRL and CTRLB from resetable delay device 30 are inputted into the NFET and PFET elements of transmission gate 54, respectively. The output of transmission gate 54 is held in the two-inverter latch 52 and also outputted as one of the ratio-logic device's output signals $LOUT_0$. The two-inverter latch 52 and transmission gate 54 insures that the output signals will be at a known state when the ratio-logic device is powered-down.

Thus, the present invention discloses a low input ratio-logic system that will significantly reduce the power consumption of devices that dissipate DC current, such as ratio-logic devices. By detecting input transitions and out-putting signals asynchronously, such as the state-change signal and the PWRD signal, the invention adds very little delay to the device and can reduce the power consumption significantly.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit for a ratio-logic device comprising:
   an input sensing device for receiving a first input having a first state and a second input having a second state, asynchronously outputting a first state-change signal if said first state differs from a state of a previous input and asynchronously outputting a second state-change signal if said second state differs from said first state; and
   a resetable delay device, coupled to said input sensing device and the ratio-logic device, for receiving said first and second state-change signal and asynchronously outputting a power-up signal to said ratio-logic device for a predetermined amount of time after said first state-change signal is received, and outputting a power-down signal to said ratio-logic device after said predetermined amount of time is over, wherein said predetermined amount of time is reset if said resetable delay device receives said second state-change signal before said predetermined amount of time is over.

2. The circuit of claim 1, further comprising:
a latch device, coupled to said ratio-logic device and said resetable delay device, for latching an output of said ratio-logic device.

3. The circuit of claim 1, wherein said input sensing device comprises:
a plurality of transition detector circuits including a first transition detector, said first transition detector receiving said first input and said second input and outputting a detection signal when said first state is different than said second state; and
an ORing logic device, coupled to said plurality of transition detector circuits and to said resetable delay device, for receiving said detection signal and outputting said second state change signal on reception of said detection signal.

4. The circuit of claim 3, wherein said first transition detector circuit comprise: an XOR circuit having a first and a second XOR input and an XOR output, wherein said first XOR input receives said first input, said second XOR input receives an inverted first input, and said XOR output outputs a logical XOR function of said first input and said inverted first input to said ORing logic device.

5. The circuit of claim 4, wherein said ORing logic device comprises:
a plurality of n-channel field-effect transistors, the gates of said plurality of n-channel field-effect transistors coupled one-on-one to the outputs of said plurality of transition detector circuits and the sources of said plurality of n-channel field-effect transistors tied to ground, wherein said plurality of n-channel field-effect transistors are equal to the number of said plurality of transition detector circuits; and
a p-channel field-effect transistor, the drain of said p-channel field-effect transistor coupled to the drains of said pluralities of n-channel field-effect transistors and said resetable delay device, the gate of said p-channel field-effect transistor coupled to ground, and the source of said p-channel field-effect transistor coupled to Vdd.

6. The circuit of claim 1, wherein said resetable delay device comprises:
a delay line having a plurality of inverters, coupled between Vdd and said ratio-logic device;
p-channel field-effect circuitry, the drains of said p-channel field-effect circuitry coupled to every other said inverter of said delay line and the gates of said p-channel field-effect circuitry receiving said first state-change signal; and
n-channel field-effect circuitry, the drains of said n-channel field-effect circuitry coupled to every other said inverter of said delay line and the gates of said n-channel field-effect circuitry receiving an inverted first state-change signal,
wherein the coupling of said p-channel field-effect circuitry to said delay line alternate with the coupling of said n-channel field-effect circuitry to said delay line between said inverters of said delay line.

7. The circuit of claim 6, wherein said resetable delay device further comprises:
a first inverter, coupled between said delay line and said latch device; and
a second inverter, coupled between said first inverter and said latch device, wherein said first and second inverter produce a first and second control output signal for controlling said latch device.

8. A method for controlling a ratio-logic device comprising the steps of:
a) providing a first input having a first state and a second input having a second state;
b) receiving said first and said second input in an input sensing device;
c) asynchronously outputting a first state-change signal if said first state differs from a state of a previous input;
d) asynchronously outputting a second state-change signal if said second state differs from said first state;
e) receiving said first and second state-change signal in a resetable delay device;
f) asynchronously outputting a power-up signal to the ratio-logic device for a predetermined amount of time after said first state-change signal is received;
g) resetting said predetermined amount of time if said resetable delay device receives said second state-change signal before said predetermined amount of time is over; and
h) outputting a power-down signal to said ratio-logic device after said predetermined amount of time is over.

9. The method of claim 8, further comprising the steps of:
i) outputting an ratio-logic device signal when said ratio-logic device is powered-up; and
j) latching said output of said ratio-logic device.

10. The method of claim 8, wherein step c) further comprises the steps of:
c1) providing a first transition detector;
c2) receiving said first input and said second input with said first transition detector;
c3) outputting a detection signal from said first transition detector when said first state is different than said second state;
c4) providing an ORing logic device;
c5) receiving said detection signal with said ORing logic device; and
c6) outputting said second state change signal on reception of said detection signal.

11. The method of claim 10, wherein step c1) further comprises the steps of:
1) providing an XOR circuit;
2) inputting said first input and an inverted first input into said XOR circuit; and
3) outputting a logical XOR function of said first input and said inverted first input to said ORing logic device.

12. A low power ratio-logic system comprising:
a ratio-logic device;
an input sensing device for receiving a first input having a first state and a second input having a second state, asynchronously outputting a first state-change signal if said first state differs from a state of a previous input and asynchronously outputting a second state-change signal if said second state differs from said first state; and
a resetable delay device, coupled to said input sensing device and the ratio-logic device, for receiving said first and second state-change signal and asynchronously outputting a power-up signal to said ratio-logic device for a predetermined amount of time after said first state-change signal is received, and outputting a power-down signal to said ratio-logic device after said predetermined amount of time is over, wherein said predetermined amount of time is reset if said resetable delay device receives said second state-change signal before said predetermined amount of time is over.

13. The system of claim 12, further comprising:

a latch device, coupled to said ratio-logic device and said resetable delay device, for latching an output of said ratio-logic device.

14. The system of claim 12, wherein said input sensing device comprises:

a plurality of transition detector circuits including a first transition detector, said first transition detector receiving said first input and said second input and outputting a detection signal when said first state is different than said second state; and an ORing logic device, coupled to said plurality of transition detector circuits and to said resetable delay device, for receiving said detection signal and outputting said second state change signal on reception of said detection signal.

15. The system of claim 14, wherein said first transition detector circuit comprise: an XOR circuit having a first and a second XOR input and an XOR output, wherein said first XOR input receives said first input, said second XOR input receives an inverted first input, and said XOR output outputs a logical XOR function of said first input and said inverted first input to said ORing logic device.

16. The system of claim 15, wherein said ORing logic device comprises:

a plurality of n-channel field-effect transistors, the gates of said plurality of n-channel field-effect transistors coupled one-on-one to the outputs of said plurality of transition detector circuits and the sources of said plurality of n-channel field-effect transistors are tied to ground, wherein said plurality of n-channel field-effect transistors are equal to the number of said plurality of transition detector circuits; and a p-channel field-effect transistor, the drain of said p-channel field-effect transistor coupled to the drains of said pluralities of n-channel field-effect transistors and said resetable delay device, the gate of said p-channel field-effect transistor coupled to ground, and the source of said p-channel field-effect transistor coupled to Vdd.

17. The system of claim 12, wherein said resetable delay device comprises:

a delay line having a plurality of inverters, coupled between Vdd and said ratio-logic device;

p-channel field-effect circuitry, the drains of said p-channel field-effect circuitry coupled to every other said inverter of said delay line and the gates of said p-channel field-effect circuitry receiving said first state-change signal; and n-channel field-effect circuitry, the drains of said n-channel field-effect circuitry coupled to every other said inverter of said delay line and the gates of said n-channel field-effect circuitry receiving an inverted first state-change signal, wherein the coupling of said p-channel field-effect circuitry to said delay line alternate with the coupling of said n-channel field-effect circuitry to said delay line between said inverters of said delay line.

18. The system of claim 17, wherein said resetable delay device further comprises:

a first inverter, coupled between said delay line and said latch device; and a second inverter, coupled between said first inverter and said latch device, wherein said first and second inverter produce a first and second control output signal for controlling said latch device.

* * * * *